United States Patent [19]

Kriedt

[11] 4,250,411
[45] Feb. 10, 1981

[54] DYNAMIC RESISTOR CURRENT LEAKAGE COMPENSATION ARRANGEMENT

[75] Inventor: Hans Kriedt, Munich, Fed. Rep. of Germany

[73] Assignee: Siemens Aktiengesellschaft, Berlin & Munich, Fed. Rep. of Germany

[21] Appl. No.: 6,869

[22] Filed: Jan. 26, 1979

[30] Foreign Application Priority Data

Jan. 31, 1978 [DE] Fed. Rep. of Germany ....... 2804142

[51] Int. Cl.³ .......................... H03L 5/00; H03G 3/00
[52] U.S. Cl. .................... 307/264; 330/254; 330/282; 330/284
[58] Field of Search .............. 330/254, 282, 284; 307/264

[56] References Cited

U.S. PATENT DOCUMENTS 4,131,809 12/1978 Baars .................. 307/264 X

FOREIGN PATENT DOCUMENTS 1965317 5/1976 Fed. Rep. of Germany .

Primary Examiner—James B. Mullins
Attorney, Agent, or Firm—Hill, Van Santen, Steadman, Chiara & Simpson

[57] ABSTRACT

Circuit arrangement for the compensation of leakage currents in control elements used for wide band amplifiers, said control elements including two transistors whose bases and collectors are respectively directly connected to one another, whose emitters form the resistor connections and in whose bases a control current is fed. A further identical control element is provided into which such a current is fed that a control current with the value required for the control process flows over its control branch; the control branch of this control element being connected to the control branch of the control element lying in the wide band amplifier for the purpose of feeding in the same control current.

2 Claims, 5 Drawing Figures

DYNAMIC RESISTOR CURRENT LEAKAGE COMPENSATION ARRANGEMENT

INTRODUCTION

The present invention relates to a circuit arrangement for the compensation of leakage currents which are conditioned by parasitic transistors in dynamic resistors used for gain control of integrated, wide band amplifiers, where such dynamic resistors are formed by two transistors whose emitters form the resistor connections and in whose bases connected with one another a control current can be fed in into the base-emitter-path forming the control branch.

Dynamic resistors of the aforementioned type are known, for example, from the German Pat. No. 1,965,317.

The basic circuit diagram as shown in FIG. 1 shows a known resistor. Thereby, two transistors 1 and 2 are respectively directly connected together with their bases and also connected together through their collectors. The base lie at a control input 5. The emitters form two resistor connections 3 and 4 between which the dynamic resistance occurs.

A possibility for use in integrated technology is illustrated in FIG. 2. There, a base area 10 with preferably two parallel n+ emitter strips 11 is located in an n-collector area 7 which is partially applied over a so-called n+ buried layer 8 as an epitaxial layer on a p substrate 9 which is generally surrounded by a p+ insulation frame 6. The base area is connected with the control input 5 and the emitter strips 11 with the posts 3 or 4, respectively.

In such an integrated structure, however, parasitic transistors arise, which, on the one hand, are formed by the p-base 10, the n-collector 7 and the p-substrate 9 as vertical pnp-transistors and, on the other hand, by the n+ emitter 11 and the p base 10 as lateral npn-transistor.

An equivalent circuit of the dynamic resistor with such parasitic transistors is illustrated in FIG. 3. The transistors connected in accordance with FIG. 1 which form the resistor are designated 12 and 13, whereas the aforementioned parasitic vertical transistors are designated with 15 and 16, and the parasitic lateral transistor which is wanted for the support of the control properties is designated 14. In order to indicate that emitter and collector are interchangeable in the symmetrically constructed lateral transistor 14, each respective connection is provided with the customary arrow for the emitter characterization.

A circuit symbol for the dynamic ohmic alternating current resistor is illustrated in FIG. 4.

If a regulating current $I_R$ now flows into the control input designated 23, then this current is divided into two use currents designated with $I_N$ and into leakage or, respectively, failing currents designated with $I_F$ which flow off via the parasitic transistors into the substrate 9 grounded at 20. It follows therefrom that the transistors 12 and 13 forming the alternating current resistor are controlled in their saturation region by the use currents $I_N$ flowing in their base-emitter-paths, so that the parasitic transistors 15 and 16 are also rendered conductive. The use current $I_N$ which determines the degree of saturation and thus the dynamic cross-resistance likewise flows via the resistor connections designated in FIG. 3 by 21 and 22. Because of this fact, the dynamic cross-resistance which is formed by the emitter-collector paths of the transistors 12, 13 and 14 becomes a function of the magnitude of the leakage currents $I_F$ flowing off into the substrate. If, in the course of time, the gain of the vertical parasitic transistors 15 and 16 is altered, then the dynamic cross-resistance is also changed and, thus, the control behavior (maximum amplification) of a wide band amplifier in which the structure under discussion is used as a control element.

SUMMARY OF THE INVENTION

The object of the present invention is to specify a possibility of holding the aforementioned use currents $I_N$ constant and the dynamic cross-resistance connected therewith.

In a circuit arrangement of the type initially referred to, this object is inventively achieved by means of the following features.

Two dynamic resistors of the same construction, of which one is charged at its resistor connections with such a current that a control current with the current required for the control process flows over the control branch, and by a coupling of the control branch of this dynamic resistor to the control branch of the other dynamic resistor for feeding in the same control current into its control branch.

Thereby, in a further embodiment of the invention, the coupling of the control branches of the dynamic resistors preferably is undertaken via a current mirror.

DESCRIPTION OF THE PREFERRED EMBODIMENTS

In the following, the invention is explained in greater detail on the basis of a sample embodiment illustrated in FIG. 5 of the drawings.

Figure 5:
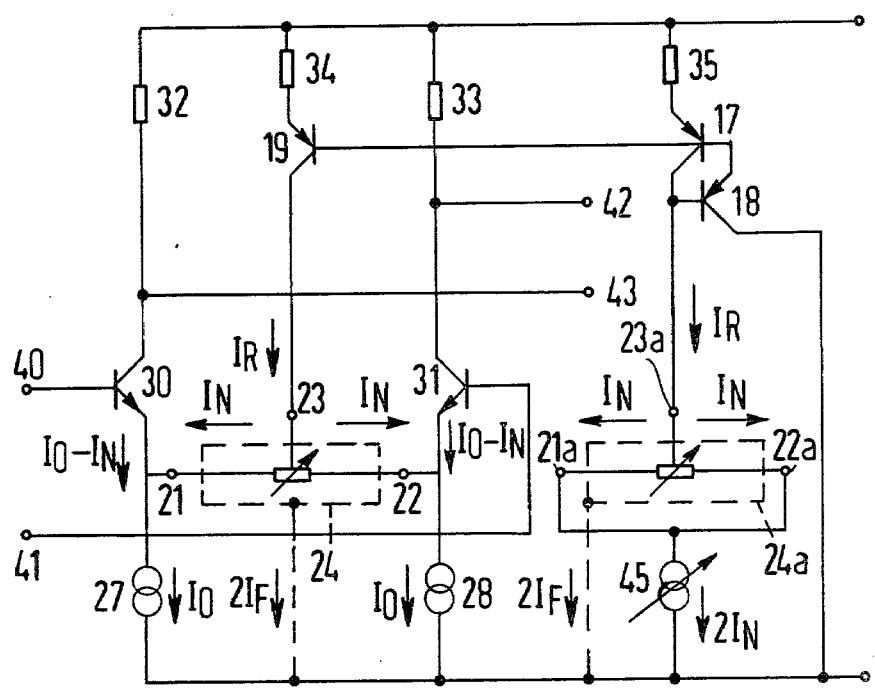
FIG. 5 shows a wide band differential amplifier with a dynamic resistance as a control element and with a further control element for the compensation of leakage current.

FIG. 5 shows a wide band differential amplifier with a dynamic resistance of the type described above as a control element and with a further such control element for the compensation of the leakage currents.

Figure 4:
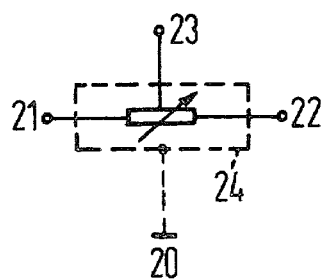
FIG. 4 shows a circuit symbol for a dynamic ohmic alternating circuit resistor.

In the circuit arrangement according to FIG. 5 constructed in integrated technology, a differential amplifier is formed in a manner known per se by two transistors 30 and 31 with collector resistors 32 and 33 as well as with current sources 27 and 28 in the emitter branches. The emitters of the transistors 30 and 31 are coupled by means of a control element in the form of a dynamic ohmic alternating current resistor 24 according to the switching symbol according to FIG. 4. The input of the wide band differential amplifier is formed by terminals 40 and 41 conducted to the bases of the transistors 30 and 31; whereas, the output is formed by posts 42 and 43 lying at the collectors of the transistors 30 and 31.

Figure 1:
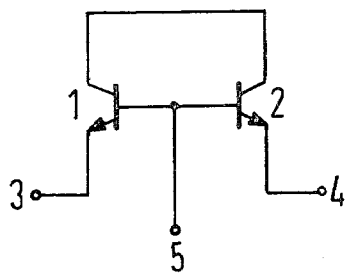
FIG. 1 is a circuit diagram of a dynamic resistor used for gain control of integrated wide band amplifiers.
Figure 2:
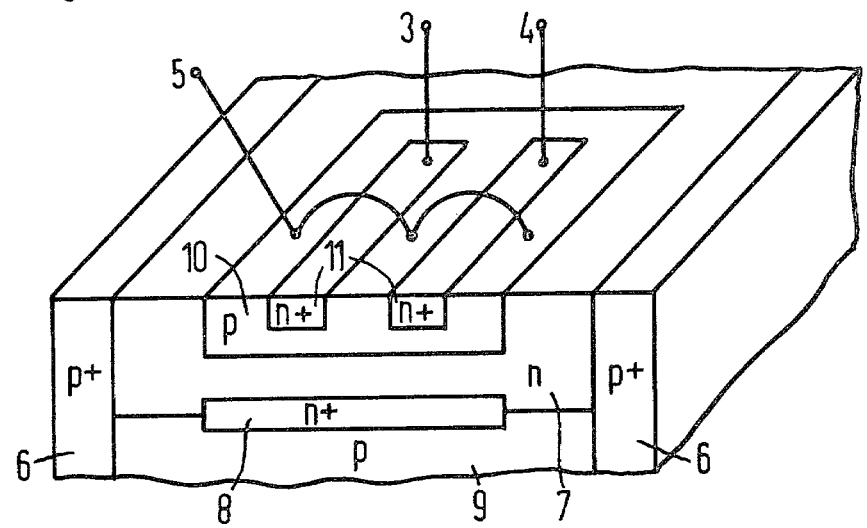
FIG. 2 is a diagrammatic illustration of how the circuit of FIG. 1 may be formed as a integrated circuit.
Figure 3:
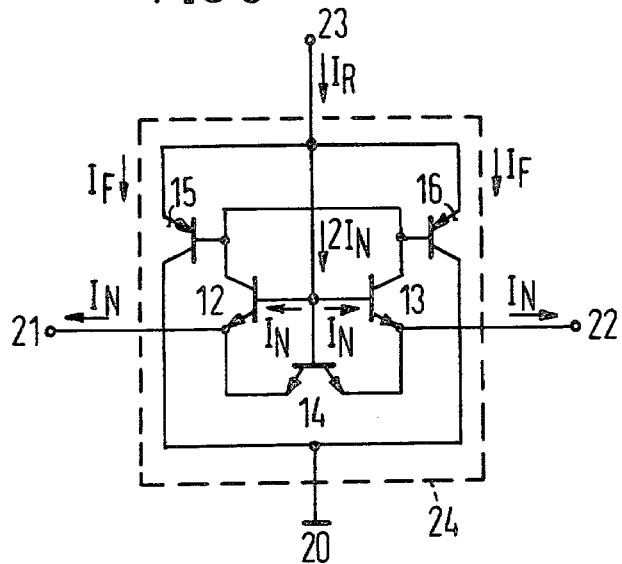
FIG. 3 is an equivalent circuit diagram of a dynamic resistor with parasitic transistors.

For the compensation of the leakage currents described above on the basis of FIG. 3, a further dynamic resistor 24a with a structure identical to that of resistor 24 is provided. Thereby, the control branches 23 and 23a of these alternating current resistors 24 and 24a are coupled to one another via a current mirror constructed in a manner known per se by means by transistors 17, 18 and 19 and resistors 34 and 35. The dynamic resistor is fed at its resistor connections 21a and 22a by a controllable current source 45. A use current $21_N$ supplied by the current source 45 is selected in such a manner that a control current $I_R$ flowing via the control branch 23a which likewise flows in the control branch 23 of the dynamic resistor 24 via the current mirror 17, 18, 19 and, thus, allows the value of the use current $I_N$ which is required for the control process of the differential amplifier to flow. Since the leakage current $21_F$ which flows off into the substrate, which is schematically indicated in FIG. 5 for the resistors 24 and 24a by means of a broken line, is added to the use current $21_N$ according to the explanation accompanying FIG. 3 and the control current $I_R$ resulting as the sum is supplied to the control element 24 in the differential amplifier, the leakage current $21_F$ also flows off toward the substrate in this control element, so that now only the use currents $I_N$ flowing because of the preselected current $21_N$ flow. Thus, the control behavior of the control element 24 has become independent of the leakage currents $I_F$.

It will be apparent to those skilled in the art that many modifications and variations may be effected without departing from the spirit and scope of the novel concepts of the present invention.

I claim as my invention:

1. A circuit arrangement for compensating leakage currents of a dynamic resistor which is employed as a gain control element of an integrated wide band amplifier, said circuit arrangement comprising:

a first dynamic resistor for connection to the amplifier as the gain control element, including two transistors having commonly connected bases constituting a first control input, commonly connected collectors, and respective emitters which serve as the resistor terminals of said first dynamic resistor;

a second dynamic resistor, including two transistors having commonly connected bases constituting a second control input, commonly connected collectors, and respective emitters which serve as the resistor terminals of said second dynamic resistor;

current charging means connected to said emitters of said second dynamic resistor for feeding a control current into the base-emitter paths of the two transistors thereof; and current control means connected to said first and second control inputs and operating to cause the currents flowing at said first and second control inputs to be equal.

2. The circuit arrangement of claim 1, wherein said current control means comprises a current mirror circuit.

* * * * *